(12) United States Patent
Hynecek

(10) Patent No.: US 10,051,214 B2
(45) Date of Patent: Aug. 14, 2018

(54) HIGH DYNAMIC RANGE AND GLOBAL SHUTTER IMAGE SENSOR PIXELS HAVING CHARGE OVERFLOW SIGNAL DETECTING STRUCTURES

(71) Applicant: SEMICONDUCTOR COMPONENTS INDUSTRIES, LLC, Phoenix, AZ (US)

(72) Inventor: Jaroslav Hynecek, Allen, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/618,899

(22) Filed: Jun. 9, 2017

(65) Prior Publication Data

US 2017/0280074 A1   Sep. 28, 2017

Related U.S. Application Data

(62) Division of application No. 14/862,859, filed on Sep. 23, 2015, now Pat. No. 9,706,142.

(51) Int. Cl.
*H04N 5/374* (2011.01)
*H04N 5/378* (2011.01)
(Continued)

(52) U.S. Cl.
CPC ......... *H04N 5/3559* (2013.01); *H01L 27/146* (2013.01); *H04N 5/353* (2013.01);
(Continued)

(58) Field of Classification Search
CPC .... H04N 5/3559; H04N 5/378; H04N 5/3745; H04N 5/3592; H04N 5/353; H04N 5/37457; H04N 5/37452; H01L 27/146
See application file for complete search history.

(56) References Cited

U.S. PATENT DOCUMENTS 5,625,210 A   4/1997  Lee et al.
7,173,228 B2  2/2007  Benthien
(Continued)

OTHER PUBLICATIONS

M. Vatteroni, inear-Logarithmic CMOS Pixel with Tunable Dynamic Range, IEEE Transactions on Education, Apr. 2011, pp. 1108-1115, vol. 58, IEEE, United States of America.
(Continued)

*Primary Examiner* — Hung Lam
(74) *Attorney, Agent, or Firm* — Treyz Law Group, P.C.; Michael H. Lyons; David K. Cole

(57) ABSTRACT

An image sensor may include an array of image sensor pixels. Each pixel may have a photodiode, a charge storage region, and a charge overflow circuit. The charge storage region may be used to operate the image sensor array in global shutter mode. During high light level illumination, the charge overflow circuit may divert charge away from the photodiode such that only a predetermined portion of the accumulated charge remains in the photodiode. During low light level illumination all of the accumulated charge may be stored in the pixel photodiode. The charge overflow circuit may include a transistor and a resistor or capacitor. By implementing a charge overflow circuit, the size of the charge storage region may be reduced while still preserving the high dynamic range and low noise of the image sensor during all light illumination conditions.

20 Claims, 7 Drawing Sheets

(51) Int. Cl.
*H04N 5/355* (2011.01)
*H04N 5/359* (2011.01)
*H04N 5/3745* (2011.01)
*H01L 27/146* (2006.01)
*H04N 5/353* (2011.01)

(52) U.S. Cl.
CPC ........... *H04N 5/3592* (2013.01); *H04N 5/378* (2013.01); *H04N 5/3745* (2013.01); *H04N 5/37452* (2013.01); *H04N 5/37457* (2013.01)

(56) References Cited

U.S. PATENT DOCUMENTS

| | | | |
|---|---|---|---|
| 7,847,847 | B2 | 12/2010 | Yaung et al. |
| 7,948,535 | B2 | 5/2011 | Ellis-Monaghan et al. |
| 8,446,158 | B1* | 5/2013 | Jansson .............. H03K 17/9622 |
| | | | 324/601 |
| 2003/0151445 | A1* | 8/2003 | Dodson, III ........... H02H 9/025 |
| | | | 327/318 |
| 2006/0044243 | A1 | 3/2006 | Rysinski |
| 2006/0113969 | A1* | 6/2006 | Hatanaka ......... G01R 19/16571 |
| | | | 323/212 |
| 2012/0300106 | A1 | 11/2012 | Kobayashi et al. |
| 2013/0012263 | A1* | 1/2013 | Goto .................... H01L 27/1461 |
| | | | 455/556.1 |
| 2013/0153975 | A1* | 6/2013 | Henseler ................. G01T 1/248 |
| | | | 257/290 |
| 2015/0060951 | A1 | 3/2015 | Hynecek |
| 2015/0069471 | A1 | 3/2015 | Kawamura |
| 2015/0155273 | A1 | 6/2015 | Nakajima et al. |
| 2015/0189199 | A1 | 7/2015 | Borremans et al. |
| 2016/0049438 | A1 | 2/2016 | Murata |
| 2016/0343751 | A1 | 11/2016 | Sze et al. |

OTHER PUBLICATIONS

K. Yasutomi, A 2.7e Temporal Noise 99.7% Shutter Efficiency 92dB Dynamic Range CMOS Image Sensor with Dual Global Shutter Pixels, ISSCC 2010 Digest of Technical Papers, Feb. 2011, p. 398, vol. 53, IEEE, United States of America.

* cited by examiner

HIGH DYNAMIC RANGE AND GLOBAL SHUTTER IMAGE SENSOR PIXELS HAVING CHARGE OVERFLOW SIGNAL DETECTING STRUCTURES

This application is a division of patent application Ser. No. 14/862,859, filed Sep. 23, 2015, which is hereby incorporated by reference herein in its entirety. This application claims the benefit of and claims priority to patent application Ser. No. 14/862,859, filed Sep. 23, 2015.

BACKGROUND

This relates to solid-state image sensor arrays and, more specifically, to High Dynamic Range (HDR) complementary metal-oxide-semiconductor (CMOS) image sensor arrays that are illuminated from the back side of a substrate and that operate in a Global Shutter (GS) mode. Global shutter image sensors require additional charge storage nodes in each image sensor pixel, which consume a significant portion of the available pixel area and thus increases the cost of the image sensors. In HDR image sensors, this problem is further exacerbated due to an additional requirement to store a larger amount of charge in the pixels than in non-HDR image sensors.

Typical image sensors sense light by converting impinging photons into electrons (or holes) that are integrated (collected) in sensor pixels. Upon completion of each integration cycle, the collected charge is converted into voltage signals, which are supplied to corresponding output terminals associated with the image sensor. Typically, the charge-to-voltage conversion is performed directly within the pixels, and the resulting analog pixel voltage signals are transferred to the output terminals through various pixel addressing and scanning schemes. The analog voltage signal can be converted on-chip to a digital equivalent before being conveyed off-chip. Each pixel includes a buffer amplifier (i.e., source follower) that drives output sensing lines that are connected to the pixels via respective addressing transistors.

After the charge-to-voltage conversion is completed and after the resulting signals are transferred out from the pixels, the pixels are reset before a subsequent integration cycle begins. In pixels that include floating diffusions (FD) serving as the charge detection nodes, this reset operation is accomplished by momentarily turning on a reset transistor that connects the floating diffusion node to a voltage reference (typically the pixel current drain node) for draining (or removing) any charge transferred onto the FD node. However, removing charge from the floating diffusion node using the reset transistor generates thermal kTC-reset noise, as is well known in the art. This kTC reset noise must be removed using correlated double sampling (CDS) signal processing techniques in order to achieve desired low noise performance. Typical CMOS image sensors that utilize CDS require at least three (3T) four transistors (4T) per pixel.

Standard CMOS sensors cannot be used for global shutter operations, because the corresponding pixel array is scanned in a sequential mode row by row. Scanning the pixel array row by row generates undesirable time skew in the image. When performing global shutter operations, it is thus necessary to incorporate another storage site into each pixel that can store charge transferred from all the photodiodes in the pixel simultaneously at one time. Charge then waits in this storage site for the sequential scan in a row by row fashion.

It is difficult adapting this device concept for high-dynamic-range (HDR) operations, as a large amount of charge must be stored in the pixels. This problem is typically solved by assigning some sensor rows or pixels in a group of pixels a shorter integration time. However, this method sacrifices the low light level resolution of the image sensor and can cause problems for rapidly changing scene illuminations. Another method is using a logarithmic charge to voltage conversion characteristic that typically has higher noise, which also sacrifices low light level performance.

It would therefore be desirable to be able to provide improved image sensor pixels for a large range of illumination levels in a global shutter mode of operation.

DETAILED DESCRIPTION

Figure 1:
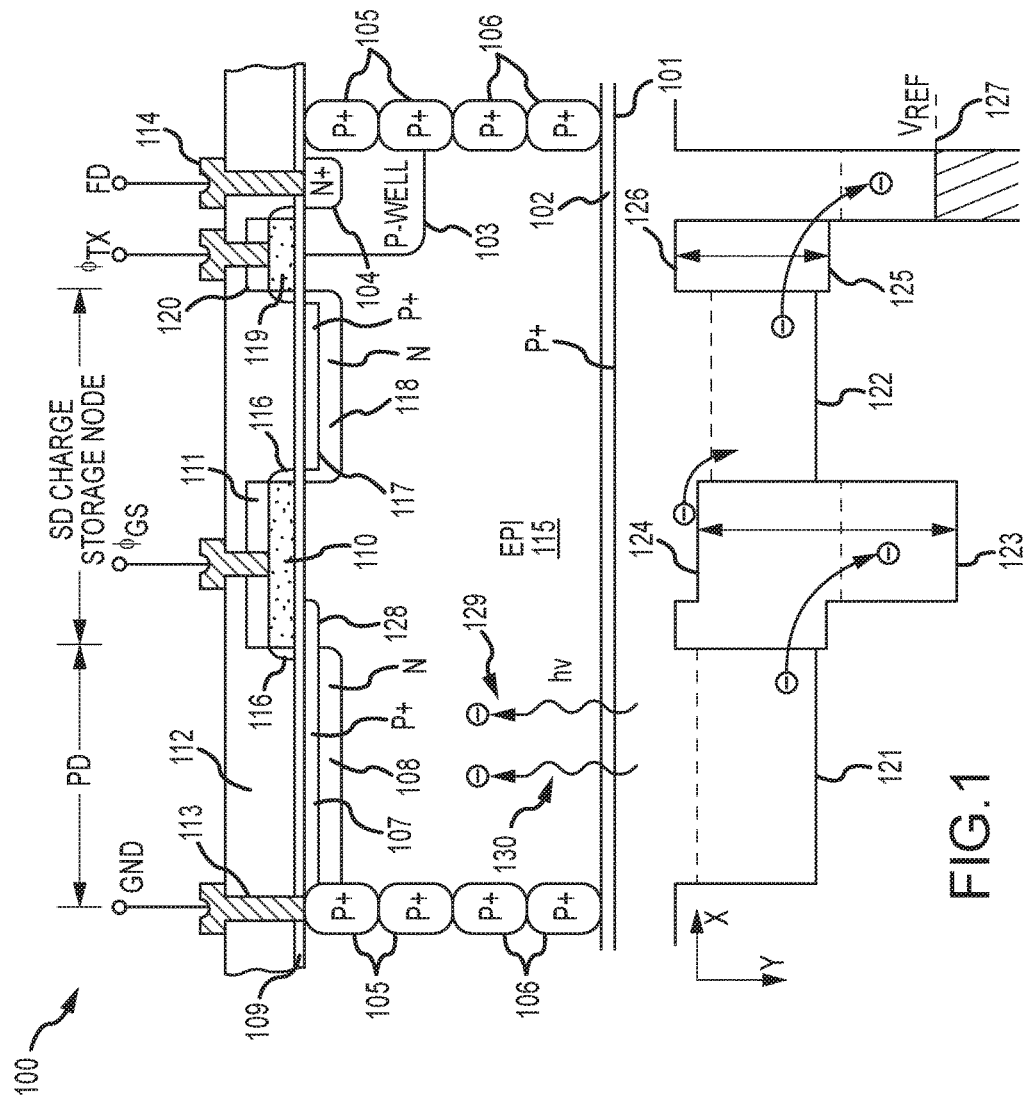
FIG. 1 is a cross-sectional side view of a GS image sensor pixel consisting of a photodiode, a global charge transfer gate, a charge storage pinned diode, a charge readout transfer gate, and a floating diffusion that is placed in a p-type doped well, and the corresponding potential profiles for various biasing conditions.

FIG. 1 shows a simplified cross sectional view of a GS device and corresponding potential profiles under each pixel region of the GS device. As shown in FIG. 1, a pixel 100 may include pixel charge storage node area SD. Pixel charge storage node area SD may occupy almost the same area of the pixel as pixel photodiode PD.

Photon generated charge 129 may be collected in photodiode region PD, which may be adjacent to charge transfer gate 110 of the pixel charge transfer transistor. The pixel may be fabricated in substrate 101 having a p+ type doped layer 102 deposited on the back surface of the substrate. Layer 102 may prevent the generation of excessive dark current by the interface states. The device substrate may further consist of epitaxial p-type doped layer 115 situated above p+ type doped layer 102. Photons 130 that enter this region may generate carriers that may be collected in the potential well of the photodiode formed in region 108. The surface of epitaxial layer 115 may be covered by oxide layer 109 that isolates all of the gates such as doped poly-silicon Global Shutter charge transfer gate GS 110 from the substrate. The poly-silicon gates may have masking cap oxide 111 and 120 deposited on top of them that serve as a patterning hard mask as well as an additional blocking mask for the ion implantation that forms the PD charge storage region. The PD may be formed by n-type doped layer 108 and p+ type doped potential pinning layer 107, which similarly to p+ type doped layer 102 reduce the interface states generated dark current. In some cases it may be advantageous to also incorporate the sidewall spacers 116 into the structure that are used to control the mutual edge positions of p+ type doped layer 107 and charge storage layer 108. The contacts to the pixel active regions and ground may be realized by opening holes 113 in the deposited Inter Level (IL) oxide layer 112 and filling them with the metal plugs 114. Several additional IL oxide layers may be deposited on the surface of the device to provide the metal to metal interconnect isolation (not shown in FIG. 1 for the sake of simplicity). Pixel-to-pixel isolation may be accomplished by pixel separation implants 105 and 106.

In order to realize global shutter operations, an additional charge storage node may be added to the pixel. The added regions may be the SD well n-type doped region 118 with corresponding pinning implant 117. These implants may be fabricated at the same time as regions 108 and 107 in the PD and may use the same implant doses and energies. Transfer gate (TX) may be added for performing readout operations, and is used for transferring charge from storage well SD to floating diffusion FD 104 during the row-by-row sequential readout. The FD region 104 may be placed in the p-well 103 that can also contain the pixel circuit transistors (not shown in FIG. 1 for the sake of simplicity).

Global shuttering may be activated by applying a pulse to Global Shutter (GS) transfer gate 110. This gate may have an additional implanted region 128 under a portion of its area, which forms the potential barrier preventing charge from flowing back into the PD during charge transfer to the storage region. Applying a pulse to the GS gate may result in a potential profile change under this gate from level 124 to level 123 and back to level 124. Charge that has accumulated in the PD potential well 121 during the integration period may be transferred to the storage well 122. During the readout cycle the TX gates of the selected row may be pulsed, which results in a potential profile change under the TX gate from level 126 to level 125 and back to level 126. This causes carriers to flow to the FD region and to change its potential from reset level 127. This change may be sensed by the SF transistor and delivered to the array column signal processing circuits located at the periphery of the image sensor array (not shown in FIG. 1 for the sake of simplicity).

Figure 2:
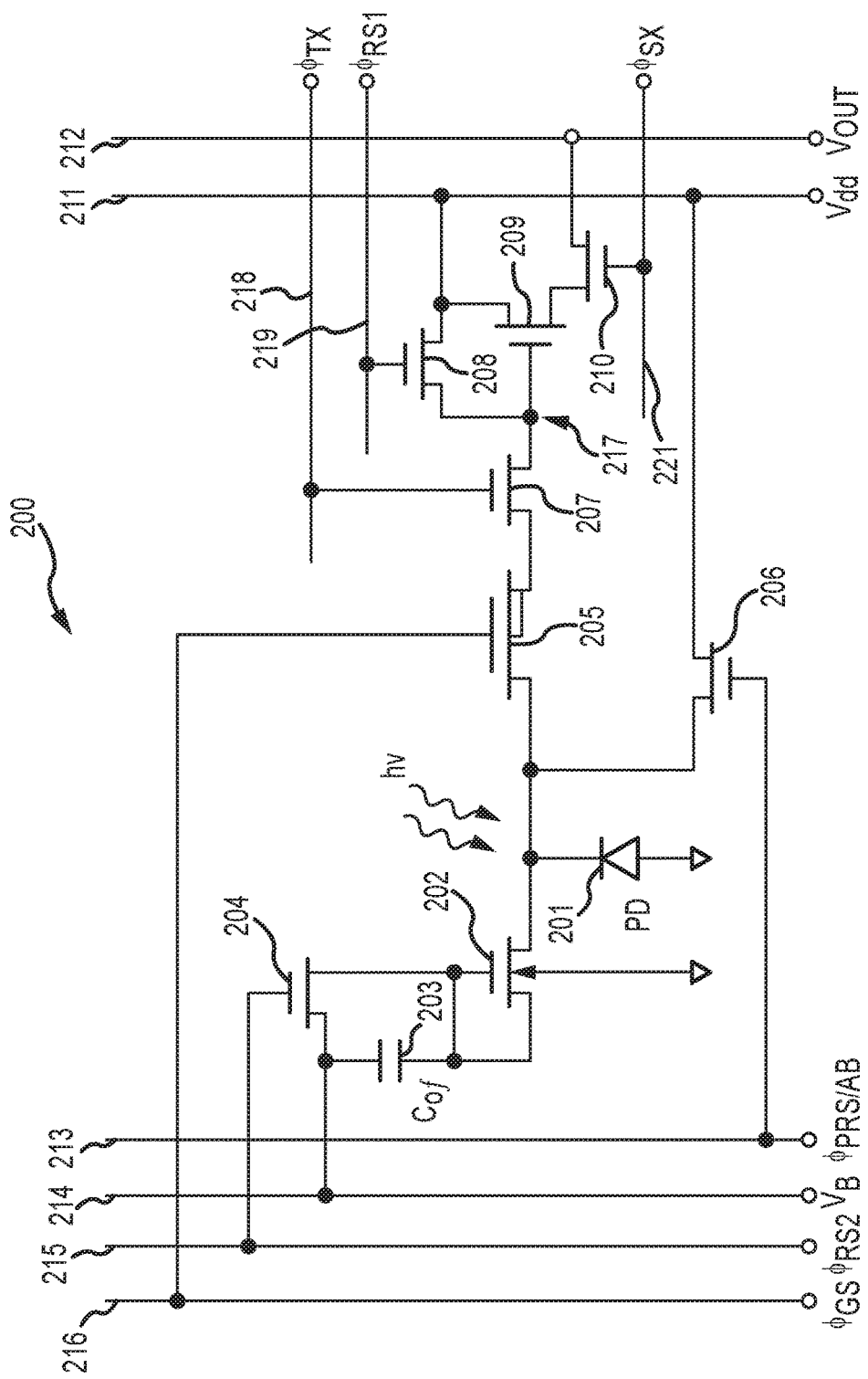
FIG. 2 is a circuit diagram of an illustrative image sensor pixel having an n-channel MOS FET that provides a potential barrier for pixel charge overflow, a capacitor for storing the charge overflow, and a compact buried channel MOS charge transfer barrier-well gate structure for storing charge in accordance with an embodiment.

A simplified circuit diagram of an illustrative image sensor pixel is shown in FIG. 2 in accordance with an embodiment. As shown in FIG. 2, pixel circuit 200 may include photodiode (PD) 201 that collects photon generated charge. The PD may be coupled to a charge overflow circuit that includes buried or surface channel transistor 202, overflow charge accumulation capacitor 203, and reset transistor 204. PD 201 may be coupled to global charge transfer-storage transistor gate 205, readout TX charge transfer transistor 207, FD node 217, and the gate of source follower (SF) transistor 209. FD node 217 may be reset by reset transistor 208 to Vdd column bias line 211, which may also be connected to the drain of SF transistor 209. The source terminal of SF transistor 209 may be connected through addressing transistor 210 to column signal line 212. The pixel circuit may further include a pixel reset transistor 206 that serves as an anti-blooming charge overflow transistor when its gate is suitably biased. Transistor 206 may completely remove all charge from the photodiode 201 thus preventing further accumulation of charge at photodiode 201.

The charge overflow circuit may include transistor 202 and capacitor 203 which serve to remove approximately 90% of the charge from the pixel in a high light level illumination condition. The remaining 10% of the charge in the pixel is used in the signal readout circuits to reconstruct the HDR signal. In a low light level pixel illumination condition, no charge is removed from the pixel by the charge overflow circuit. The pixel readout operation may be controlled by supplying the appropriate pulses through charge transfer control line 218, row addressing control line 221, and reset control line 219 (e.g., lines 218, 221, and 219 may be row control lines coupled to row control circuitry). Global shutter operations using pixel 200 may be controlled by control signals provided over overflow capacitor reset control line 215, pixel anti-blooming/reset line 213, overflow capacitor bias line Vb 214, and Global Shutter control line 216 (e.g., lines 215, 213, 214, and 216 may be column control lines coupled to column control and readout circuitry). Charge transfer-storage transistor 205 includes a charge barrier transfer region and a buried channel charge storage region and can be biased such that, during the charge storing period, the silicon-silicon dioxide interface under this gate is filled with holes, thereby minimizing the dark current generation by the interface states. This structure is preferable for global shutter charge storage, because it is very efficient in utilizing valuable pixel area and does not contribute to excessive dark current generation.

Figure 3:
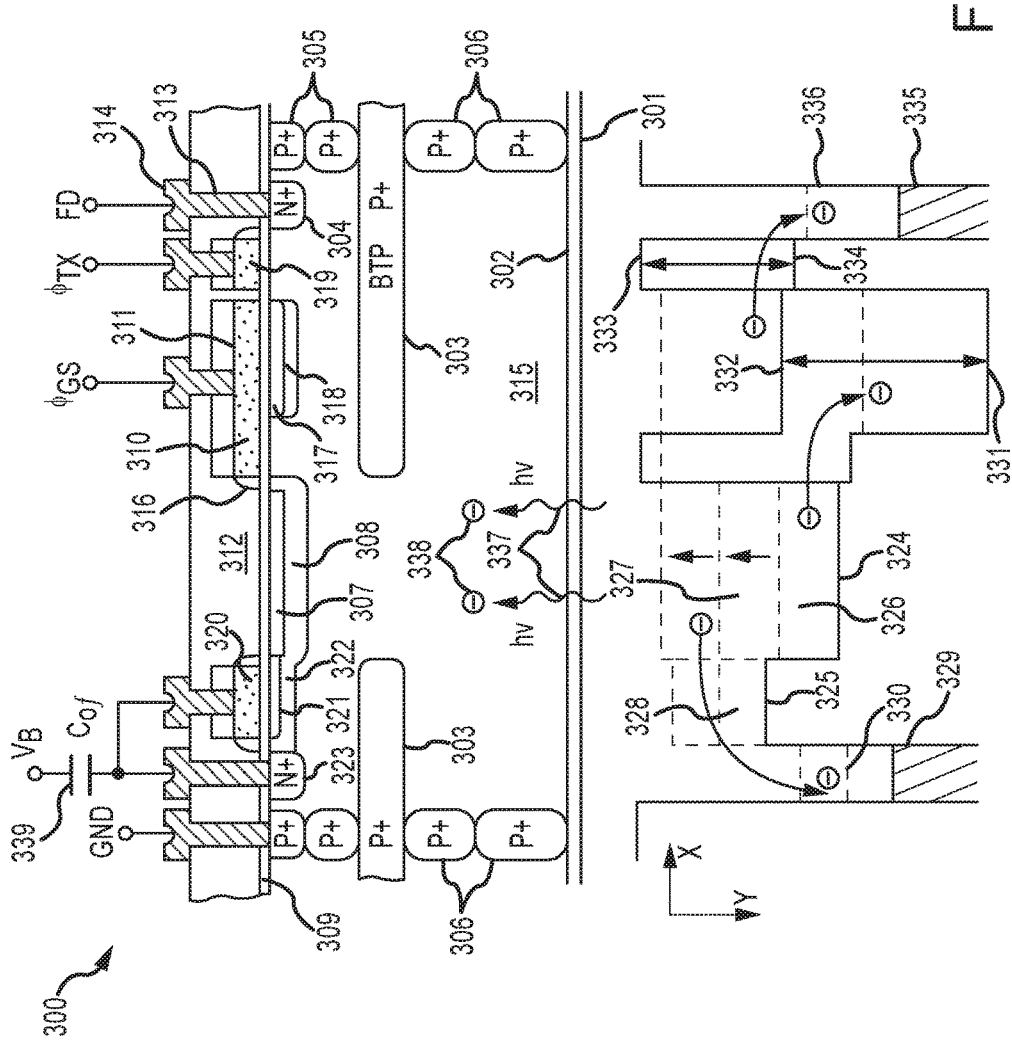
FIG. 3 is a cross-sectional side view of an illustrative image sensor pixel having a buried channel global charge transfer-storage gate and corresponding potential profiles for various pixel biasing conditions in accordance with an embodiment.

FIG. 3 is a cross sectional view of an illustrative pixel and a corresponding potential diagram. As shown in FIG. 3, pixel 300 may be a global shutter high dynamic range pixel (e.g., a pixel such as pixel 200 as shown in FIG. 2). Photon generated charge 338 may be collected in the PD region, which may be adjacent to charge transfer-storage gate 310 of the charge transfer-storage transistor. The pixel may be fabricated in substrate 301 which has a p+ type doped layer 302 deposited on the back surface. Layer 302 may prevent the generation of excessive dark current by the interface states. The device substrate may further include an epitaxial p− type doped epitaxial layer 315 situated above p+ type doped layer 302. The photon generated carriers may be collected in the potential well of the photodiode formed in region 308. The surface of the epitaxial layer 315 may be covered by oxide layer 309 that isolates all doped poly-silicon gates such as the Global Shutter charge transfer-storage gate GS 310 from the substrate. The poly-silicon gates may have a masking cap oxide 311 deposited on top of them that may serve as a patterning hard mask as well as an additional blocking mask for the ion implantation that forms the PD charge storage region. The PD may be formed by n-type doped layer 308 and p+ type doped potential pinning layer 307 which, similarly to the p+ type doped layer 302, reduces the interface states generated dark current. In some cases, it may be advantageous to also incorporate the sidewall spacers 316 into the structure which may be used to control the mutual edge positions of p+ type doped layer 307 and charge storage layer 308. The contacts to the pixel active regions and ground may be realized by opening holes 313 in the deposited Inter Level (IL) oxide layer 312 and may be filled with metal plugs 314. Several additional IL oxide layers may be deposited on the surface of the device to provide the metal to metal interconnect isolation (not shown for the sake of simplicity). Pixel-to-pixel isolation may be accomplished by the pixel separation implants 305 and 306.

To perform global shutter operations, an additional charge storage well may be formed under charge transfer-storage gate 310. For example, well 318 and threshold adjustment implant 317 that prevents the generation of excessive dark current when the GS gate is biased in its charge storage mode may be formed under gate 310. The GS gate 310 (e.g., similar to gate 205 of FIG. 2) may interface with charge transfer gate TX 319, which is used for transferring charge from the storage well to FD 304 during a signal row by row sequential readout. FD region 304 may be shielded from the collection of stray charge by p-type doped BTP region 303. This region may also extend under the pixel circuit transistors (not shown for the sake of simplicity).

The HDR function of pixel 300 may be realized by adding a buried or surface channel transistor to the pixel that is coupled to the pinned PD. The buried or surface channel transistor may include transistor gate 320 and drain 323. The suitable potential profile may be formed by buried or surface channel implants 321 and 322 in this region. The transistor design is such that it provides a charge overflow barrier directing the overflow charge to flow into the charge overflow capacitor 339, thereby lowering its reset level bias and consequently increasing the charge overflow barrier for charge that has accumulated in the pixel. Approximately 90% of the charge generated by the pixel at high light level illumination may thus be diverted to the charge overflow capacitor 339 and only 10% of the charge may remain in the pixel (for example). This function is indicated in the potential diagram shown in FIG. 3, where PD potential level 324 and overflow barrier 325 represent low light level conditions. As charge accumulates in the PD the potential is gradually lowered to level 326 and further to level 327. This change is facilitated by the potential overflow barrier, which lowers the potential from empty PD level 325 to higher light illumination level 328. The potential overflow barrier may also further lower the potential below higher light illumination level 328. The barrier lowering is facilitated by the drain-gate connection and as the drain 323 lowers its bias reset level 329 to the level 330, the gate bias follows this change.

The global shutter operation proceeds by applying a pulse to global shutter charge transfer-storage gate 310 for all pixels of the pixel array at the same time. This is indicated in the potential profile diagram by potential change under the gate 310 changing from level 332 to level 331 and back. This sequence is then followed by the row by row readout, which is activated by applying a readout charge transfer pulse to the TX gate 319. This causes the potential under this gate to change from level 333 to level 334 and back. This action thus transfers charge from the GS storage well onto the FD and changes its reset level 335 to signal level 336.

Because approximately 10% of the high light level illumination charge may be stored in the pixel, the pixel size does not need to be increased. This effectively compresses the pixel dynamic range, which is then recovered in the signal processing circuits. On the other hand, the low light level illumination charge is not affected. This preserves the pixel high sensitivity and low noise without compromising the image sensor array resolution.

Figure 4:
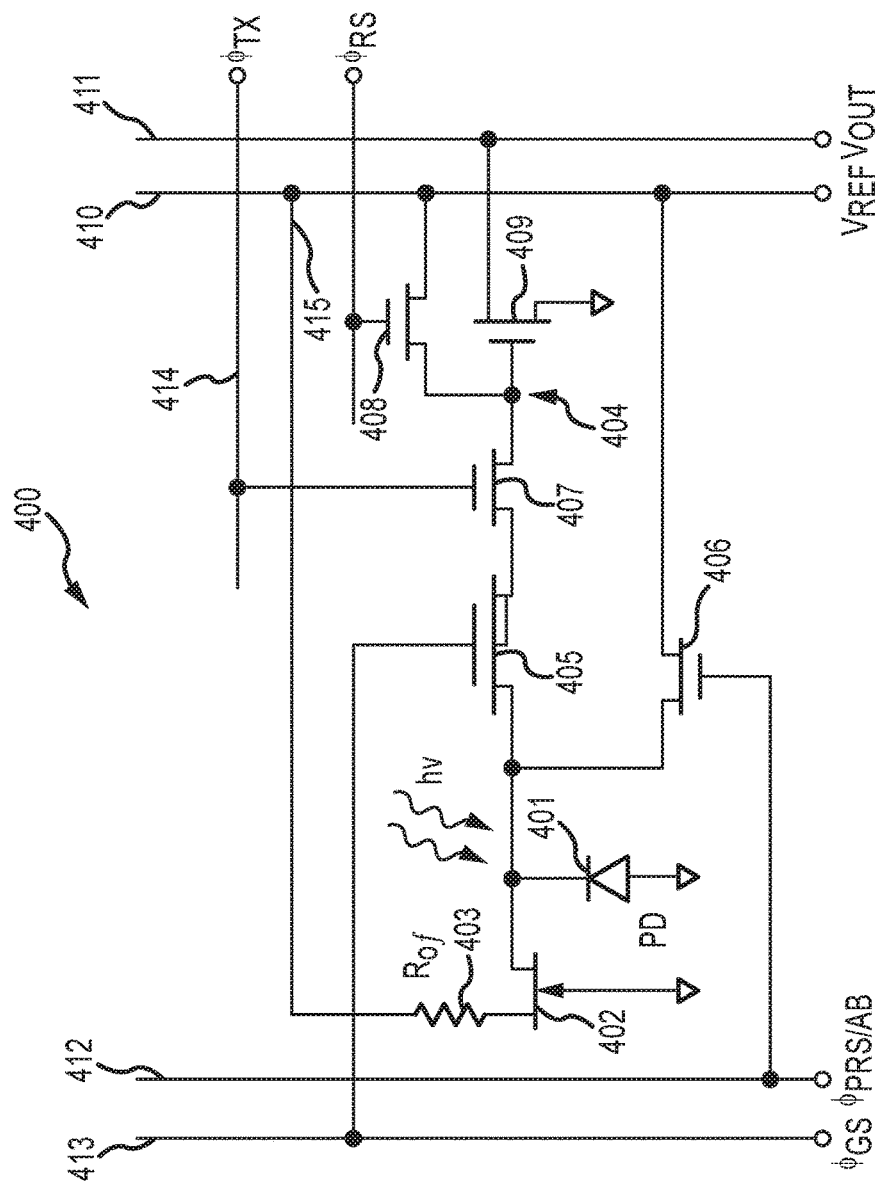
FIG. 4 is a circuit diagram of an illustrative image sensor pixel having an n-channel Junction FET that provides a potential barrier for pixel charge overflow, a high value resistor connected to the JFET drain, and a compact buried channel MOS barrier-well gate structure for storing charge in accordance with an embodiment.

Another suitable arrangement for the image sensor pixels is shown in FIG. 4. As shown in FIG. 4, pixel 400 may include PD 401 that collects the photon-generated charge. The PD may be coupled to a special charge overflow circuit that includes JFET transistor 402 and high value resistor 403 (e.g., a resistor having a relatively large resistance value). The PD may be further coupled to global charge transfer-storage transistor gate 405, readout TX charge transfer transistor 407, FD node 404, and the gate of p-channel SF transistor 409. FD node 404 may be reset by reset transistor 408 to level Vref provided by column bias line 410. The source of p-channel SF transistor 409 may be coupled to column signal line 411 and the drain of transistor 409 may be connected to the pixel ground. The pixel circuit may further include the pixel reset transistor 406, which also serves as an anti-blooming charge overflow transistor when its gate is suitably biased. Transistor 406 has the capability to completely remove all charge from the pixel and thus prevent further accumulation of charge. The charge overflow circuit may include transistor 402 and high value resistor 403.

Figure 5:
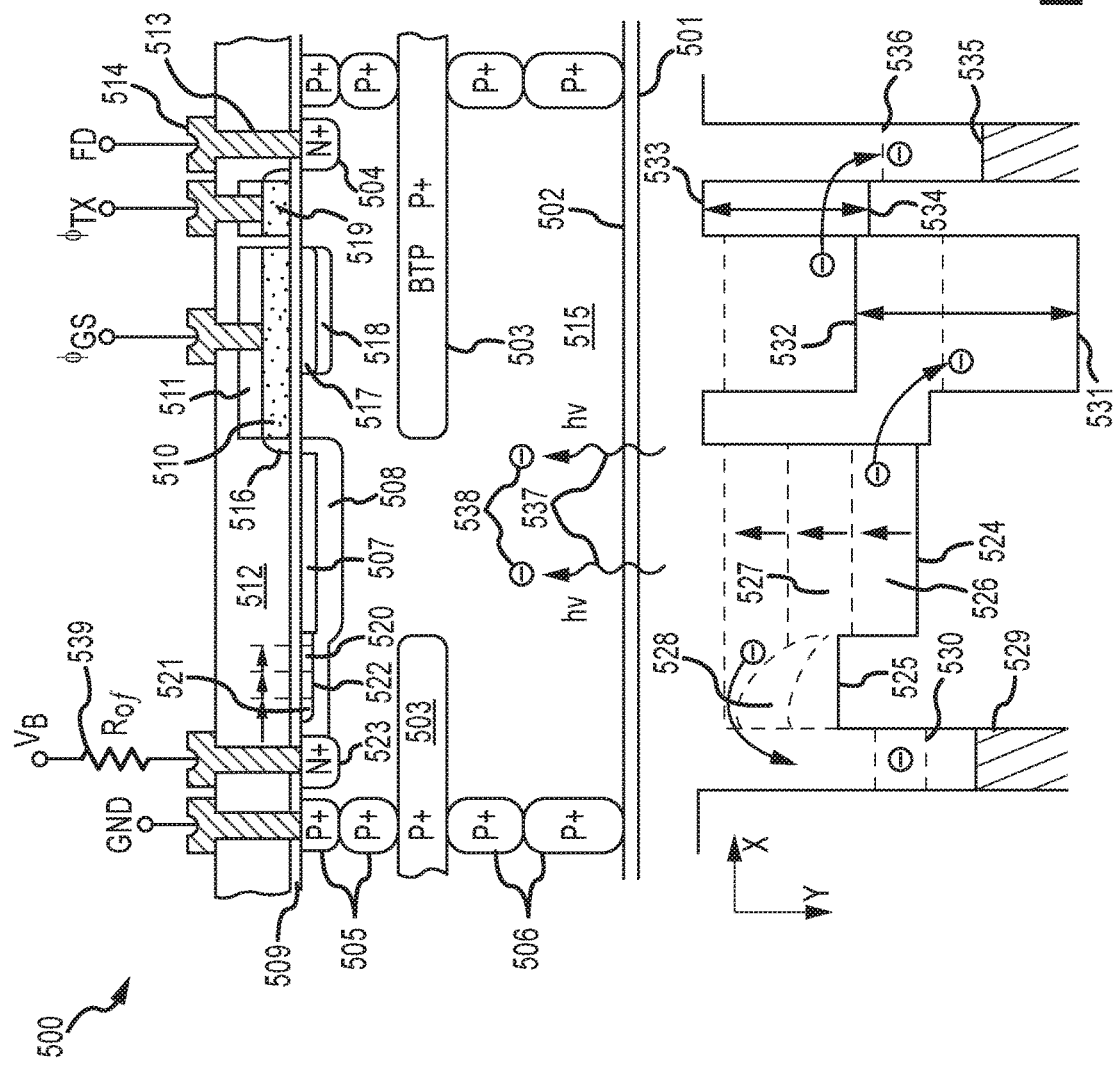
FIG. 5 is a cross-sectional side view of an illustrative image sensor pixel having a charge overflow structure that has the capability of overflow potential barrier modulation and a buried channel global charge transfer-storage gate and corresponding potential profiles under the different pixel regions for various pixel biasing conditions in accordance with an embodiment.

The charge overflow circuit may serve to remove approximately 90% of the charge from the pixel in a high light level illumination condition (for example). The remaining 10% of the charge in the pixel may be used in the signal readout circuits to reconstruct the HDR signal. In a low light level pixel illumination condition, no charge may be removed from the pixel by the charge overflow circuit. The pixel readout operation may be controlled by supplying the appropriate pulses to the pixel through row charge transfer readout control line 414 and the FD node row reset control line 415. Global Shutter-operations using pixel 400 may be controlled by control signals provided over pixel antiblooming/reset line 412 and the Global Shutter control line 413 (e.g., lines 412 and 413 may be column control lines coupled to column control and readout circuitry). Charge transfer-storage transistor 405 includes a charge transfer barrier region and a buried channel charge storage region, which can be biased such that during the charge storing period, the silicon-silicon dioxide interface under the gate is filled with holes thereby minimizing the generation of dark current by the interface states. The HDR GS pixel design in the example of FIG. 4 may be simpler than that of FIG. 2, as the example of FIG. 4 requires fewer pixel controlling signals FIG. 5 is a cross sectional view of an illustrative pixel and a corresponding potential diagram. As shown in FIG. 5, pixel 500 may be a global shutter high dynamic range (e.g., a pixel such as pixel 500 as shown in FIG. 5). Photon generated charge 538 may be collected in the PD region, which may be adjacent to charge transfer gate 510 of the charge transfer transistor. The pixel may be fabricated in substrate 501 that may have a p+ type doped layer 502 deposited on the back surface. Layer 502 may prevent the generation of excessive dark current by the interface states. The device substrate may further include an epitaxial p− type doped layer 515 situated above p+ type doped layer 502. The photon generated carriers may be collected in the potential well of the photodiode formed in region 508. The surface of the epitaxial layer 515 may be covered by oxide layer 509 that isolates the gates such as the doped poly-silicon Global Shutter charge transfer-storage gate GS 510 from the substrate. The poly-silicon gates may have a masking cap oxide 511 deposited on top of them that serves as a patterning hard mask as well as an additional blocking mask for the ion implantation that forms the PD charge storage region. The PD may be formed by n-type doped layer 508 and the p+ type doped potential pinning layer 507, which similarly to the p+ type doped layer 502 reduces the interface states generated dark current. In some cases, it may be advantageous to also incorporate the sidewall spacers 516 into the structure that are used to control the mutual edge positions of p+ type doped layer 507 and the charge storage layer 508. The contacts to the pixel active regions and ground may be realized by opening holes 513 in the deposited Inter Level (IL) oxide layer 512 and may be filled with the metal plugs 514. Several additional IL oxide layers may be deposited on the surface of the device to provide the metal to metal interconnect isolation (not shown for the sake of simplicity). Pixel to pixel isolation may be accomplished by the pixel separation implants 505 and 506.

To perform Global Shutter operations, an additional charge storage well may be formed under the charge transfer-storage gate 510. For example, well 518 and the threshold adjustment implant 517 that prevents the generation of excessive dark current when the GS gate is biased in its charge storage mode may be formed under gate 510. The GS gate 510 (e.g., similar to gate 405 of FIG. 4) may interface with charge transfer gate TX 519, which is used for transferring charge from the storage well to FD 504 during a signal row by row sequential readout. FD region 504 may be shielded from the collection of stray charge by p− type doped BTP region 503. This region may also extend under the pixel circuit transistors (not shown for the sake of simplicity).

The HDR function of the pixel may be realized by adding a JFET transistor to the pixel that is coupled to the pinned PD. The JFET transistor may be formed by the laterally expandable p+ type doped gate 520-521 and by drain 523. A suitable potential profile may be formed by channel implant 522 and the implants forming the laterally expandable gate 520–521. This JFET transistor design is such that it provides the charge overflow barrier directing the overflow charge to flow into the charge overflow high value resistor 539, thereby lowering the bias of the JFET drain 523 and consequently increasing the charge overflow barrier for charge that has accumulated in the pixel. The JFET drain bias thus modulates the charge overflow barrier. Approximately 90% of the charge generated by the pixel at high level illumination may thus be diverted to the charge overflow resistor 539 whereas only 10% of the charge may remain in the pixel (for example). This function is indicated in the potential diagram where the PD potential level 524 and the overflow barrier 525 represent the low light level condition. As charge accumulates in the PD, the potential is gradually lowered to level 526 and further to level 527. This change is facilitated by the potential overflow barrier lowering from empty PD level 525 to higher illumination level 528. The potential overflow barrier may also further lower the potential below the higher illumination level 528. This barrier lowering is facilitated by the drain induced barrier modulation. As the potential level of drain 523 lowers from the overflow current bias level 529 to level 530, the barrier modulation also follows this change.

The example of FIGS. 2-5 are merely illustrative and do not serve to limit the scope of the present invention. In another suitable arrangement, the high value resistor of FIGS. 4 and 5 may be replaced by a capacitor with a reset transistor. In yet another suitable arrangement, the MOS FET transistor as shown in FIG. 2 may be replaced by a junction gate transistor. It may also be possible to build such a structure by simply implanting first the p-type doped barrier followed by an n+ type doped junction region using the same mask. In general, any other desired GS charge storage structures may be used with the arrangement of FIGS. 2-5, such as the GS charge storage structure described in connection with FIG. 1.

Figure 6:
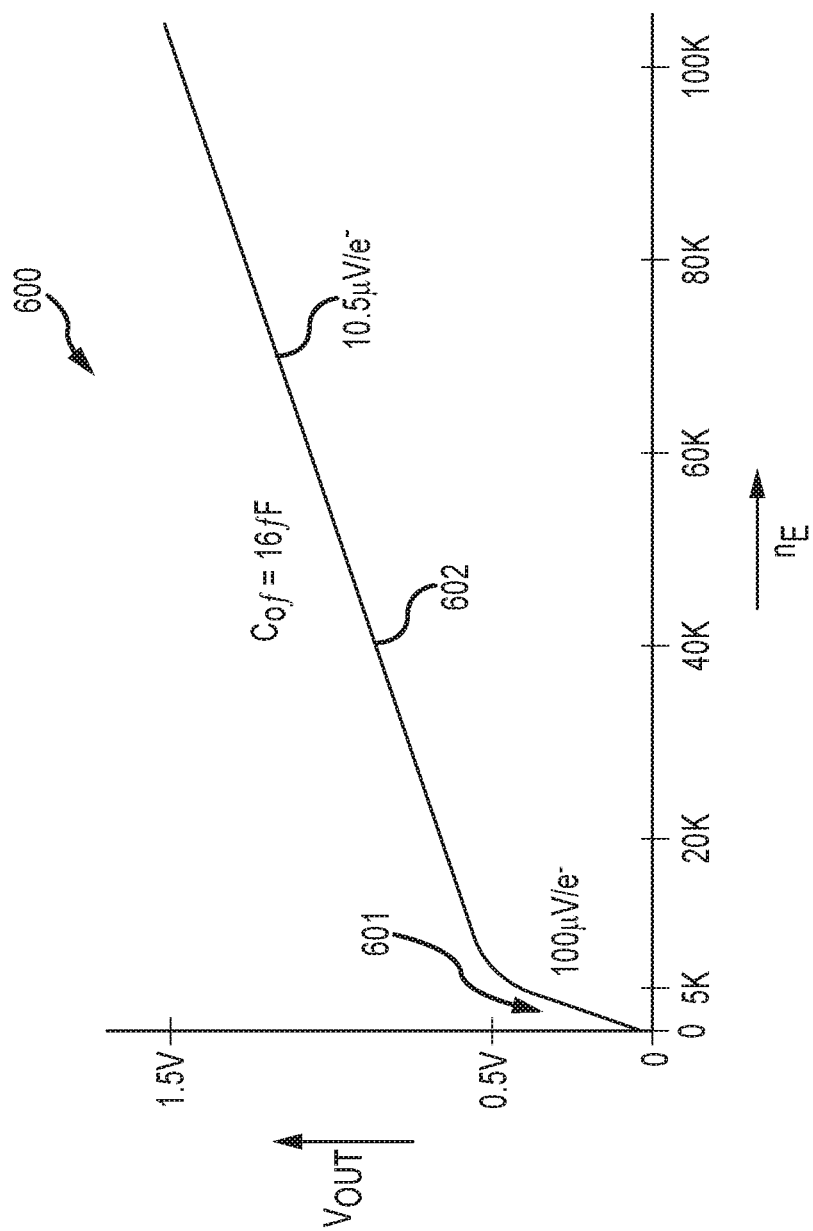
FIG. 6 is an illustrative graph showing the relationship between the number of electrons collected in a pixel photodiode of the type shown in FIGS. 2 and 3 and the corresponding output voltage from the pixel during charge readout in accordance with an embodiment.

FIG. 6 is an illustrative graph showing the dependency of pixel voltage output on the number of collected carriers in the pixel. As shown in FIG. 6, graph 600 includes a portion 601 that represents the case where no charge is lost from the PD due to charge overflow. Portion 602 of graph 600 represents the case where there is charge overflow to a capacitor (e.g., a 16 femto Farad capacitor). This example is merely illustrative. In general, other capacitance values for the capacitor may be used and other threshold values designed for where charge overflow begins may be used. In another suitable arrangement, the pixels having different capacitor values and different overflow thresholds may be organized into groups of super-pixels or organized in alternate rows of the image sensor array, so that an additional dynamic range increase is realized without the loss of resolution or sensitivity in low light level illumination conditions.

Figure 7:
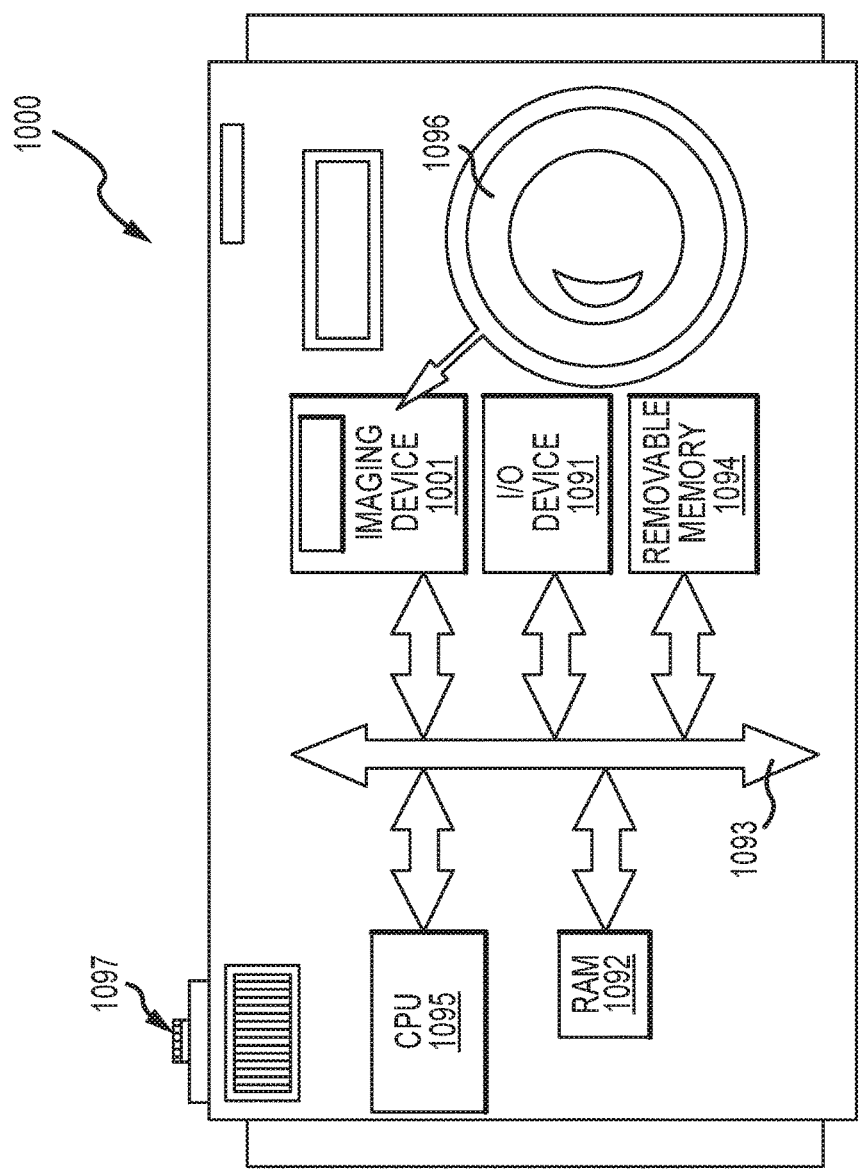
FIG. 7 is a block diagram of a processor system employing the image sensor pixels shown and described in connection with FIGS. 2-6 in accordance with an embodiment.

FIG. 7 shows in simplified form a typical processor system 10, such as a digital camera, which includes an imaging device such as imaging device 1001 (e.g., an imaging device 1001 such as an image sensor that includes the backside illuminated global shutter pixels with a charge overflow structure as described above in connection with FIGS. 2-6). Processor system 1000 is exemplary of a system having digital circuits that could include imaging device 1001. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 1000, which may be a digital still or video camera system, may include a lens such as lens 1096 for focusing an image onto a pixel array when shutter release button 1097 is pressed. Processor system 1000 may include a central processing unit such as central processing unit (CPU) 1095. CPU 1095 may be a microprocessor that controls camera functions and one or more image flow functions and communicates with one or more input/output (I/O) devices 1091 over a bus such as bus 1093. Imaging device 1001 may also communicate with CPU 1095 over bus 1093. System 1000 may include random access memory (RAM) 1092 and removable memory 1094. Removable memory 1094 may include flash memory that communicates with CPU 1095 over bus 1093. Imaging device 1001 may be combined with CPU 1095, with or without memory storage, on a single integrated circuit or on a different chip. Although bus 1093 is illustrated as a single bus, it may be one or more buses or bridges or other communication paths used to interconnect the system components.

Various embodiments have been described illustrating an imaging system (e.g., image sensor pixel array) having a charge overflow mitigation structure that allows for a smaller charge storage region when the pixel array operates in global shutter operation. Dynamic range is also increased relative to conventional imaging systems. The array may further include a number of image sensor pixels arranged in rows and columns.

The image sensor pixels may each include a photodiode that generates charge in response to image light, an additional charge storage region, a floating diffusion node, a global charge transfer-storage transistor configured to transfer the generated charge from the photodiode to the additional charge storage region, and a charge transfer transistor configured to transfer the charge from the additional charge storage region to the floating diffusion node. A charge overflow circuit may be coupled to the photodiode and configured to divert overflow charge from the photodiode.

The charge overflow circuit may include a transistor, a capacitor, and a reset transistor configured to reset the charge stored on the capacitor. The transistor may act as a charge overflow barrier directing the overflow charge from the photodiode to the capacitor. Charge from the photodiode may be diverted to the capacitor during a high light level illumination condition, whereas no charge may be diverted to the capacitor during a low light level illumination condition. This may reduce the size of the additional charge storage region and allow the image sensor to maintain a high dynamic range when operating in global shutter operation.

In another suitable arrangement, the charge overflow circuit may include a JFET transistor and a high value resistor. The JFET transistor may act as a charge overflow barrier directing the overflow charge from the photodiode to the resistor. Charge from the photodiode may be diverted to the resistor during a high light level illumination condition, whereas no charge may be diverted to the resistor during a low light level illumination condition. This may reduce the size of the additional charge storage region and allow the image sensor to maintain a high dynamic range when operating in global shutter operation.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel, comprising:
   a photodiode that generates charge in response to image light;
   a charge storage region configured to store the generated charge;
   a charge transfer transistor coupled between the photodiode and the charge storage region;
   a resistor, wherein the resistor is configured to divert at least some of the generated charge away from the photodiode; and
   a transistor coupled between the photodiode and the resistor.

2. The image sensor pixel defined in claim 1, wherein the charge storage region comprises a pinned diode.

3. The image sensor pixel defined in claim 1, wherein the transistor exhibits a charge overflow barrier potential, and wherein the charge overflow barrier potential increases as the generated charge flows from the photodiode to the resistor.

4. The image sensor pixel defined in claim 1, wherein the transistor comprises a junction gate transistor.

5. The image sensor pixel defined in claim 4, wherein the junction gate transistor comprises a laterally expandable p+ type doped gate having channel implants.

6. The image sensor pixel defined in claim 5, wherein the junction gate transistor is biased to modulate an amount of charge diverted away from the photodiode.

7. The image sensor pixel defined in claim 6, wherein the amount of charge diverted away from the photodiode is less in a low light level pixel illumination condition than in a high light level pixel illumination condition.

8. The image sensor pixel defined in claim 1, wherein the resistor is coupled between the transistor and a reference voltage line.

9. The image sensor pixel defined in claim 8, further comprising a pixel reset transistor coupled to the reference voltage line and between the photodiode and the charge transfer transistor.

10. The image sensor pixel defined in claim 9, wherein the pixel reset transistor comprises an anti-blooming charge overflow transistor.

11. The image sensor pixel defined in claim 10, wherein the pixel reset transistor is configured to remove the generated charge from the pixel.

12. The image sensor pixel defined in claim 1, wherein the transistor is configured to divert charge away from the photodiode and towards the resistor when the generated charge reaches a given threshold level and wherein the transistor is configured to not divert charge away from the photodiode when the generated charge is below the given threshold level.

13. The image sensor pixel defined in claim 1, wherein the image sensor pixel is formed in a pixel substrate and wherein at least a portion of the charge storage region is formed in the pixel substrate directly below the charge transfer transistor.

14. The image sensor pixel defined in claim 1, wherein the transistor comprises a p-type doped barrier adjacent to an n+ type toped junction.

15. The image sensor pixel defined in claim 1, further comprising:
    a floating diffusion node;
    an additional charge transfer transistor coupled between the floating diffusion node and the charge storage node, wherein the additional charge transfer transistor is configured to transfer the generated charge from the charge storage region to the floating diffusion node; and
    a row charge transfer readout control line coupled to the additional charge transfer transistor, wherein the row charge transfer readout control line conveys signals to the additional charge transfer transistor that control pixel readout operations.

16. The image sensor pixel defined in claim 15, further comprising a source follower transistor coupled to the floating diffusion node and a column signal line.

17. An image sensor pixel, comprising:
    a photodiode that generates charge in response to image light;
    a charge storage region configured to store the generated charge;
    a global charge transfer transistor coupled between the photodiode and the charge storage region;
    a charge overflow circuit coupled to the photodiode, wherein the charge overflow circuit comprises:
      a junction gate transistor coupled to the photodiode; and
      a resistor coupled to the junction gate transistor, wherein the resistor is configured to divert generated charge away from the photodiode.

18. The image sensor pixel defined in claim 17, wherein the charge overflow circuit is configured to remove approximately 90% of the generated charge in a high light level illumination condition.

19. The image sensor pixel defined in claim 17, wherein the charge overflow circuit is configured to remove none of the generated charge in a low light level pixel illumination condition.

20. An image sensor pixel, comprising:
    a photodiode that generates charge in response to image light;

a charge storage region configured to store the charge generated by the photodiode;

a first charge transfer transistor coupled between the photodiode and the charge storage region, wherein the first charge transfer transistor is controlled by a global shutter signal that is configured to activate the first charge transfer transistor to transfer the generated charge from the photodiode to the charge storage region;

a transistor coupled to the photodiode;

a resistor coupled to the transistor, wherein the resistor is configured to divert overflow charge away from the photodiode;

a floating diffusion region; and a second charge transfer transistor coupled between the charge storage region and the floating diffusion node, wherein the second charge transfer transistor is configured to transfer the generated charge from the charge storage region to the floating diffusion region.

* * * * *